United States Patent
Fujiwara

(10) Patent No.: US 7,280,359 B2
(45) Date of Patent: Oct. 9, 2007

(54) HEAT-RADIATING STRUCTURE OF ELECTRONIC APPARATUS

(75) Inventor: Norio Fujiwara, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 380 days.

(21) Appl. No.: 11/005,016

(22) Filed: Dec. 7, 2004

(65) Prior Publication Data

US 2005/0128709 A1    Jun. 16, 2005

(30) Foreign Application Priority Data

Dec. 11, 2003  (JP)  ............. 2003-412982

(51) Int. Cl.
  *H05K 7/20*  (2006.01)
  *F28F 7/00*  (2006.01)
(52) U.S. Cl. .............. 361/704; 165/80.3; 165/185; 361/687; 361/705; 361/708; 361/710
(58) Field of Classification Search .......... None
  See application file for complete search history.

(56) References Cited

U.S. PATENT DOCUMENTS 5,255,738 A * 10/1993 Przilas ................ 165/185
5,343,940 A *  9/1994 Jean .................... 165/104.33
5,991,155 A * 11/1999 Kobayashi et al. ..... 361/705
6,257,328 B1 *  7/2001 Fujiwara et al. ....... 165/185
6,982,874 B2 *  1/2006 Smalc et al. .......... 361/704

FOREIGN PATENT DOCUMENTS

JP    2000-311050    11/2000
JP    2001-142574     5/2001

* cited by examiner

*Primary Examiner*—Gregory D Thompson
(74) *Attorney, Agent, or Firm*—Wenderoth, Lind & Ponack, L.L.P.

(57) ABSTRACT

In a heat-radiating structure HRS1 in which heat generated in a heat-generating component built in a housing of an electronic apparatus is conducted to the outside, the central portion of a flexible graphite sheet that is folded and shaped so as to be elastic is thermally connected to the heat-generating component, and a flexible conductive member is applied to a portion in which the central portion is thermally connected to the heat-generating component.

12 Claims, 7 Drawing Sheets

HEAT-RADIATING STRUCTURE OF ELECTRONIC APPARATUS

BACKGROUND OF THE INVENTION

1. Field of the Invention

The present invention relates to a heat-radiating mechanism of a portable electronic apparatus, for example, a notebook-type personal computer. More specifically, the present invention relates to a heat-radiating structure.

2. Description of the Background Art

Referring to FIG. 7, a heat-radiating mechanism of a conventional portable electronic apparatus will be described by taking a notebook-type personal computer as an example. In notebook-type personal computers, a heat-radiating plate 53 made of copper or aluminum having a thickness from about 0.5 mm to 2.0 mm is tightly attached to a CPU 2, which is a heat-generating component mounted in a print wiring board 51 to release and radiate heat generated in the CPU 2 to the outside via a heat-radiating plate 53. When sufficient heat radiation is not expected with such a structure, a portion of the heat-radiating plate 53 is brought in contact with an aluminum keyboard supporting plate 6 on the back of the keyboard so that the heat in the CPU 2 is also radiated to the keyboard supporting plate 6.

However, metal such as copper and aluminum used for the heat-radiating plate 53 or the keyboard supporting plate 6 is highly rigid, and is hardly deformed by an external stress, thus its shape including its height is fixed. Furthermore, the CPU 2, the heat-radiating plate 53, and the keyboard supporting plate 6 are not completely smooth, because of, for example, fabrication tolerance or a change in shape over time or due to heat.

Therefore, when the height from the CPU 2 to the keyboard supporting plate 6 is structurally fixed, a space (clearance) is inevitably generated between the CPU 2 and the heat-radiating plate 53 and between the heat-radiating plate 53 and the keyboard supporting plate 6, so that they cannot be attached tightly to each other. This space functions as a contact thermal resistance between the CPU 2 and the heat-radiating plate 53 and between the heat-radiating plate 53 and the keyboard supporting plate 6, and prevents heat from moving, that is, being radiated, from the CPU 2 to the heat-radiating plate 53 and the keyboard supporting plate 6.

A space (clearance) between the CPU 2 and the heat-radiating plate 53 is referred to as "thermal conduction resistance space IS". The distance in which the heat-radiating plate 53 is spaced apart from the CPU 2 is referred to as "resistance distance Dis", and the area in which the thermal conduction resistance space IS is present in the direction parallel to the CPU 2 and the heat-radiating plate 53 is referred to as "resistance area Ais" (not shown). The size of the thermal conduction resistance space IS is referred to as "thermal resistance space size Vis".

In order to reduce this contact thermal resistance, Japanese Laid-Open Patent Publication No. 2001-142574 discloses a method of providing a flexible thermal conductive member such as a heat-radiating grease 56 (not shown) or elastic heat-radiating elastomer 57 between the CPU 2 and the heat-radiating plate 53 and between the heat-radiating plate 53 and the keyboard supporting plate 6 to eliminate the thermal conduction resistance space IS. In this method, it is attempted to improve the heat transfer properties by replacing the air in the thermal conduction resistance space IS generated between the CPU 2 and the heat-radiating plate 53 and between the heat-radiating plate 53 and the keyboard supporting plate 6 with a flexible thermal conductive member or material having a larger thermal conductivity than that of air. In other words, the flexible conductive member in an amount corresponding to the thermal resistance space size Vis is filled in the thermal conduction resistance space IS.

In practice, each of the CPU 2, the heat-radiating plate 53 and the keyboard supporting plate 6 each exhibit a dimensional tolerance of 0.5 mm or more. Therefore, when the CPU 2, the heat-radiating plate 53 and the keyboard supporting plate 6 are brought in contact, they are spaced apart at a gap of 0.5 mm or more, and the thermal conduction resistance space IS is generated there. In other words, in order to eliminate the thermal conduction resistance space IS with a resistance distance Dis of 0.5 mm, it is necessary to fill with heat-radiating grease 56 or the heat-radiating elastomer 57 to a thickness of 0.5 mm or more. It is also necessary to determine the amount of the heat-radiating grease 56 or the heat-radiating elastomer 57 to be filled, in view of variation in the thermal resistance space size Vis of the thermal conduction resistance space IS due to thermal expansion or thermal contraction of the components caused in the process of absorbing and radiating heat from the CPU 2.

However, the thermal conductivity of the heat-radiating grease 56 or the heat-radiating elastomer 57 is larger than the thermal conductivity of air, but smaller than the thermal conductivity of copper or aluminum. Therefore, the heat transfer properties are poorer than when the CPU 2, the heat-radiating plate 53 and the keyboard supporting plate 6 are in direct contact. From this point of view, it is necessary to reduce the amount of the flexible thermal conductive member to be filled, that is, to reduce thermal conduction resistance space IS as much as possible. However, a slightly excessive amount of flexible thermal conductive member is provided to accommodate a change in the thermal resistance space size Vis of the thermal conduction resistance space IS.

SUMMARY OF THE INVENTION

Therefore, an object of the present invention is to provide a heat-radiating mechanism and a heat-radiating structure that accommodates a variation in size due to component tolerance when conducting and radiating heat from a heat-generating component in an electronic apparatus to the outside and to provide improved heat-radiating performance.

The present invention has the following features to attain the object mentioned above.

The present invention is directed to a heat-radiating structure in which heat generated in a heat-generating component built in a housing of an electronic apparatus is conducted to the outside, including a flexible first graphite sheet shaped so as to be elastic by including both end portions positioned substantially on the same plane, both rising portions that cross those two end portions at a predetermined angle, and a central portion positioned on a plane substantially in parallel to the two end portions; and a flexible thermal conductive member. In the first graphite sheet, the central portion is thermally connected to the heat-generating component, and at least one of the two end portions is thermally connected to at least one of the housing and a heat-radiating component that is fixed to the housing. The flexible conductive member is applied to a portion in which the first graphite sheet is thermally connected to the heat-generating component.

In the heat-radiating mechanism of an electronic apparatus of the present invention, a graphite sheet is pressed elastically against a heat-generating component such as CPU and a heat-radiating component such as a keyboard supporting plate on the back of a keyboard. The arrangement utilizes the flexibility of the graphite sheet, so that a clearance generated therebetween can be minimized. As a result, the contact thermal resistance between the heat-generating component and the graphite sheet and between the graphite sheet and the keyboard supporting plate is reduced, and thus the heat-radiating performance of the electronic apparatus can be improved.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
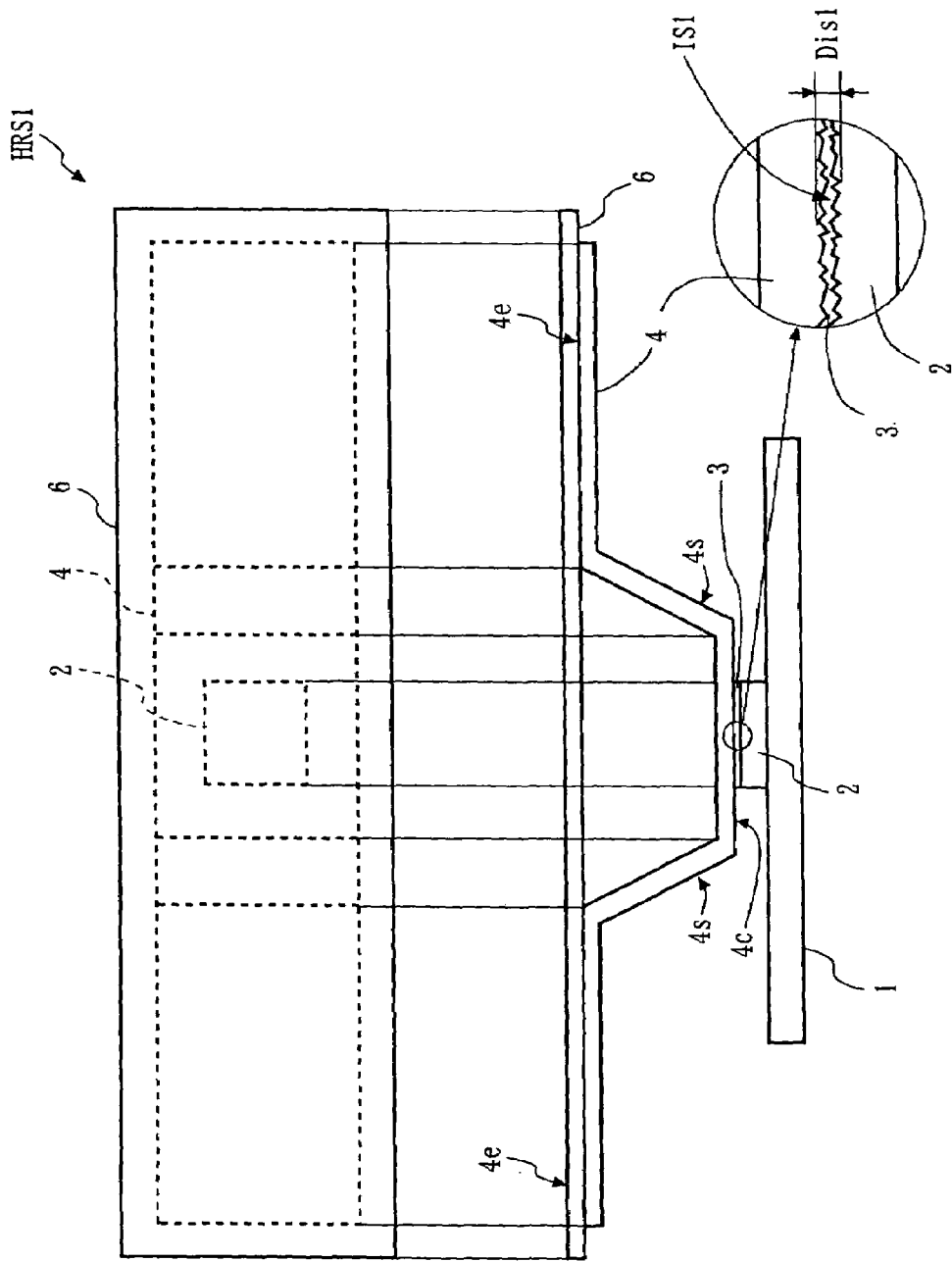
FIG. 1 is a side view showing a heat-radiating structure of a first embodiment of the present invention.

A heat-radiating mechanism and a heat-radiating structure of an electronic apparatus of the first embodiment of the present invention will be described with reference to FIG. 1. FIG. 1 shows a state viewed from the side of a heat-radiating mechanism provided inside a notebook-type personal computer as an example of an electronic apparatus. It should be noted that members that are irrelevant to the heat-radiating mechanism such as a housing and a power source, are not shown.

Figure 7:
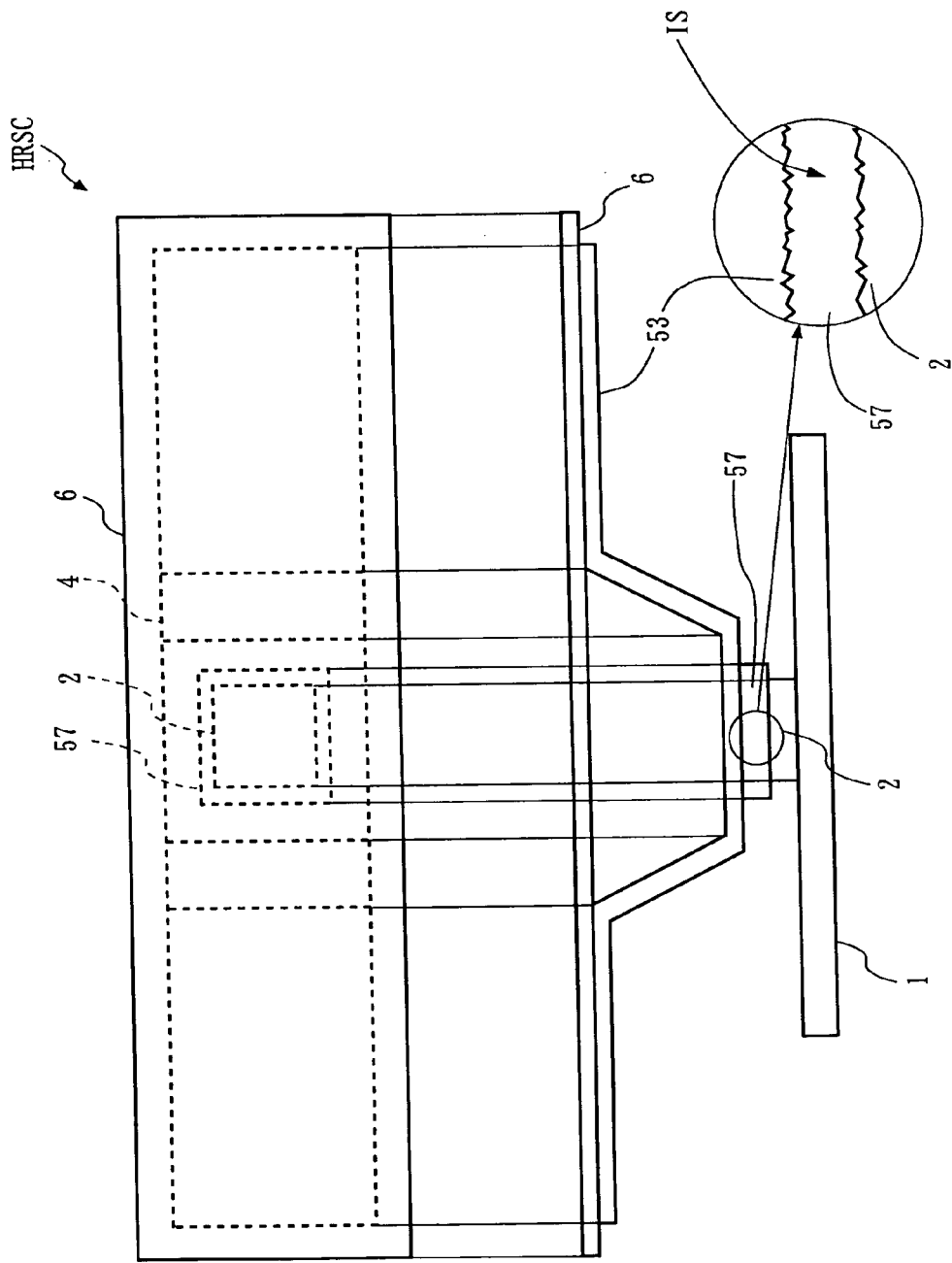
FIG. 7 is a side view showing a conventional heat-radiating structure.

In the notebook-type personal computer of this example, a heat-radiating grease 3 is applied to a CPU 2, which is a heat-generating component mounted in a print wiring board 1. Thereafter, a flexible graphite sheet 4 having a high thermal conductivity in the plane direction is thermally connected thereto in a such a manner that the lower surface of its central portion 4c that is obtained by folding the sheet with steps is attached in a non-fixed manner, and the upper surface of both end portions 4e of the graphite sheet 4 is tightly attached and thermally connected to a keyboard supporting plate 6 made of aluminum on the back side of a keyboard (not shown). The rising portions 4s connecting the two end portions 4e to the central portion 4c allow the graphite sheet 4 to be shaped into an elastic structure. In other words, the heat-radiating plate 53 and the heat-radiating elastomer 57 in the conventional heat-radiating mechanism shown in FIG. 7 are replaced by the graphite sheet 4.

In other words, in this embodiment, the graphite sheet 4 is used as heat-radiating means for conducting heat in the CPU 2 to the keyboard, instead of the heat-radiating plate 53. Therefore, a space (clearance) between the graphite sheet 4 and the CPU 2 is referred to as "thermal conduction resistance space IS1". The distance at which the graphite sheet 4 is spaced apart from the CPU 2 is referred to as "resistance distance Dis1", and the area in which the thermal conduction resistance space IS1 is present in the direction parallel to the graphite sheet 4 and the CPU 2 is referred to as "resistance area Ais1". The size of the thermal conduction resistance space IS1 is referred to as "thermal resistance space size Vis1".

The graphite sheet 4 is folded and thus is shaped so as to include two end portions 4e, two rising portions 4s and one central lower surface 4c, as shown in FIG. 1. More specifically, the two end portions 4e are positioned substantially in the same plane, the central portion 4c is positioned in a plane substantially parallel to the end portions 4e, and the two rising portions 4s are formed so as to cross the end portions 4e and the central portion 4c at predetermined angles. Consequently, the graphite sheet 4 can support elastically the central portion 4c with the rising portions 4s.

The upper surfaces of the two end portions 4e of the graphite sheet 4 are tightly fixed to the keyboard supporting plate 6 reliably with mechanical joining means such as screws (not shown). Since the heat-radiating plate 53 made of a metal in the conventional heat-radiating mechanism is highly rigid, a large clearance (thermal conduction resistance space IS) between the heat-radiating plate and the CPU 2 due to manufacturing tolerance of the components, a temporary deformation or thermal expansion is generated. On the other hand, the graphite sheet 4 of the present invention is bonded by the adsorptive power of the heat-radiating grease 3 applied to the CPU 2 and due to the spring effect induced by its flexibility and the folding, is pressed elastically to the CPU 2 so that the clearance generated between the CPU 2 and the graphite sheet 4 is accommodated.

In other words, the graphite sheet 4 is deformed more easily than the heat-radiating plate 53 and accommodates a variation in the size of the components due to fabrication tolerance, temporary deformation or temperature change. As a result, the resistance distance Dis1 of the thermal conduction resistance space IS1 generated between the CPU 2 and the graphite sheet 4 is much smaller than the resistance distance Dis of the thermal conduction resistance space IS in the conventional heat-radiating mechanism, which is 0.5 mm. The minimum resistance distance Dis1 is reduced to that caused by the surface roughness of the graphite sheet 4 and the CPU 2. Consequently, the resistance area Ais1 and the thermal resistance space size Vis1 of the thermal conduction resistance space IS1 are also much smaller than the resistance area Ais and the thermal resistance space size Vis of the thermal conduction resistance space IS in the conventional heat-radiating mechanism.

Thus, in the present invention, the thermal conduction resistance space IS1 that is generated between the graphite sheet 4 and the CPU 2 acts as a contact thermal resistance. By bending the graphite sheet 4 so as to accommodate the fabrication tolerance of the components, the thermal conduction resistance space is reduced to the surface roughness of the graphite sheet 4 and the CPU 2. Furthermore, the graphite sheet 4 can accommodate a change in the size of the components due to temporary deformation and thermal change with its flexibility.

However, the amount of the heat-radiating grease 3 applied in the thermal conduction resistance space IS1 generated between the graphite sheet 4 and the CPU 2 is small, corresponding to the thermal resistance space size Vis1. More specifically, the heat-radiating grease 3 is applied to a thickness of up to 0.3 mm and a thickness of at least the resistance distance Dis1, which is a thickness to which the grease can be applied in practice.

Thus, the contact thermal resistance between the CPU 2 and the graphite sheet 4 is provided in an area smaller than the area in which the graphite sheet 4 and the keyboard supporting plate 6 are provided. Therefore, the heat in the CPU 2 can be absorbed and moved effectively. The graphite sheet 4 and the keyboard supporting plate 6 are tightly attached mechanically to each other in a reliable manner, so that the heat in the CPU 2 is conducted to the keyboard supporting plate 6 efficiently via the graphite sheet 4. In this manner, in the heat-radiating mechanism of the present invention, the contact thermal resistance between the heat-generating portion, the heat-absorbing portion and the heat-radiating portion is reduced more than in the conventional heat-radiating mechanism and thus the overall heat-radiating performance can be improved.

As described above, in the present invention, the flexible graphite sheet having a high thermal conductivity in the plane direction is folded with steps and utilized as a heat-radiating plate. Thus, even in the case where a clearance may be formed between the heat-generating component and the heat-radiating plate, or between the heat-radiating plate and the keyboard supporting plate because of the tolerance of the components, the flexibility of the graphite sheet is utilized so that the graphite sheet is deformed and thus a clearance can be prevented from being formed between the heat-generating component and the graphite sheet, or between the graphite sheet and the keyboard supporting plate without generating residual stress. Furthermore, the graphite sheet has good heat transfer properties, so that the heat-radiating performance of an entire electronic apparatus can be improved.

In order to improve the workability for forming the heat-radiating mechanism, a thin heat-radiating elastomer having a strong adsorptive power may be used, instead of the heat-radiating grease 3, or they can used in combination. It is preferable that the graphite sheet 4 used as a means for absorbing and moving the heat in the CPU 2 has a thermal conductivity in the plane direction of 100 (W/mK) or more and a thickness of 0.5 to 2.0 mm and is also flexible. However, the graphite sheet 4 can be selected as appropriate, depending on the shape and the size of the components constituting the heat-radiating mechanism used, the fabrication tolerance, the amount of heat generated in the CPU 2, the necessary amount of heat to be radiated, and the like.

In this embodiment, the graphite sheet 4 and the heat-radiating grease 3 constitute the minimum unit constituting a heat-radiating structure HRS1 that realizes the function of capturing (absorbing) heat generated in the CPU 2. Furthermore, the keyboard supporting plate 6 is provided as one component of the heat-radiating structure HRS1 so that the heat captured from the CPU 2 is released to the outside of the personal computer.

In this example, as shown in FIG. 1, the graphite sheet 4 is folded such that the rising portions 4s of the graphite sheet 4 cross the central lower surface 4c and the two end portions 4e at predetermined angles to assume approximately a shape of a trapezoid. As a result, the graphite sheet 4 provides a spring effect and thus serves to press the central lower surface 4c against the CPU 2. Therefore, the graphite sheet 4 may have, for example, a rectangular shape or a curved shape, as long as the shape allows the central lower surface 4c of the graphite sheet 4 to be pressed against the CPU 2 stably with a desired spring effect.

Figure 2:
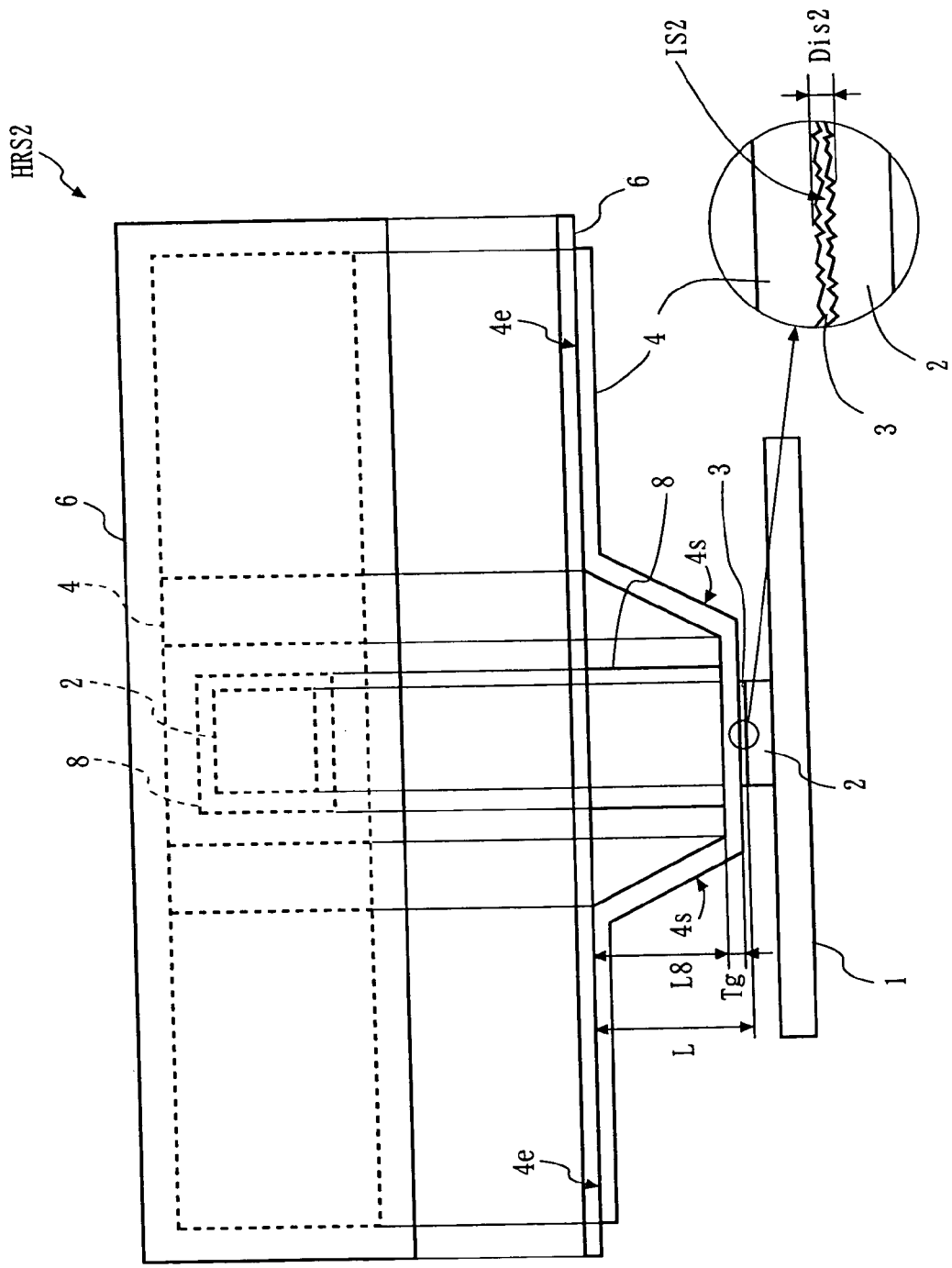
FIG. 2 is a side view showing a heat-radiating structure of a second embodiment of the present invention.

The heat-radiating mechanism of an electronic apparatus of a second embodiment of the present invention will be described with reference to FIG. 2. Similarly to in FIG. 1, FIG. 2 shows a state viewed from the side of the heat-radiating mechanism configured inside a notebook-type personal computer as an example of an electronic apparatus. A heat-radiating structure HRS2 of this embodiment is configured by adding an elastic member 8 to the heat-radiating structure HRS1 shown in FIG. 1. In this embodiment, a space (clearance) between the graphite sheet 4 and the CPU 2 is referred to as "thermal conduction resistance space IS2". The distance in which the graphite sheet 4 is spaced apart from the CPU 2 is referred to as "resistance distance Dis2", and the area in which the thermal conduction resistance space IS2 is present in the direction parallel to the graphite sheet 4 and the CPU 2 is referred to as "resistance area Ais2". The size of the thermal conduction resistance space IS2 is referred to as "thermal resistance space size Vis2".

The elastic member 8 is provided in a space formed between the graphite sheet 4 and the keyboard supporting plate 6. The elastic member 8 is formed of an elastic material such as urethane foam or melamine foam, and its length L8 can be expressed by an equation (1) below, taking the thickness of the graphite sheet 4 as Tg, and the distance from the lower surface of the keyboard supporting plate 6 to the upper surface of the CPU 2 as L, $$L8 = L - Tg - Dis2 + \Delta L \qquad \text{Equation (1)}$$

where $\Delta L$ is the compression length of the elastic member 8 and is a predetermined length necessary to apply a predetermined pressure to the CPU 2. More specifically, $\Delta L$ is determined as appropriate, based on the bending amount of the graphite sheet 4, the elastic modulus of the elastic member 8, the area in which the elastic member 8 is in contact with the CPU 2 and the graphite sheet 4, and the required pressing force of the graphite sheet 4 against the CPU 2.

The elastic member 8 is compressed between the graphite sheet 4 and the keyboard that are tightly fixed to each other reliably with screws or the like, and this reaction force presses the lower surface of the central portion of the folded graphite sheet 4 against the CPU 2. As a result, the graphite sheet 4 is attached more tightly to the CPU 2 with the pressing force of the elastic member 8, in addition to the spring effect by the folding structure of the graphite sheet 4 itself, than in the heat-radiating structure HRS1.

It is understood from the above equation (1) that if the compression length $\Delta L$ is increased, the resistance distance Dis2 can be reduced. In other words, the CPU 2 and the graphite sheet 4 are attached to each other more tightly than in the case of the heat-radiating structure HRS1, so that the resistance distance Dis2, the resistance area Ais2 and the thermal resistance space size Vis2 can be smaller than the resistance distance Dis1, the resistance area Ais1 and the thermal resistance space size Vis1, respectively. In other words, the thermal conduction resistance space IS2 is also smaller than the thermal conduction resistance space IS1, so that the amount of the heat-radiating grease 3 to be applied can be reduced.

Thus, the amount of the flexible thermal conductive member applied between the CPU 2 and the graphite sheet 4 can be reduced, so that the contact thermal resistance between the graphite sheet 4 and the keyboard supporting plate 6 can be reduced, and thus the heat-radiating performance of the heat-radiating structure HRS2 can be increased more than in the heat-radiating structure HRS1.

Figure 3:
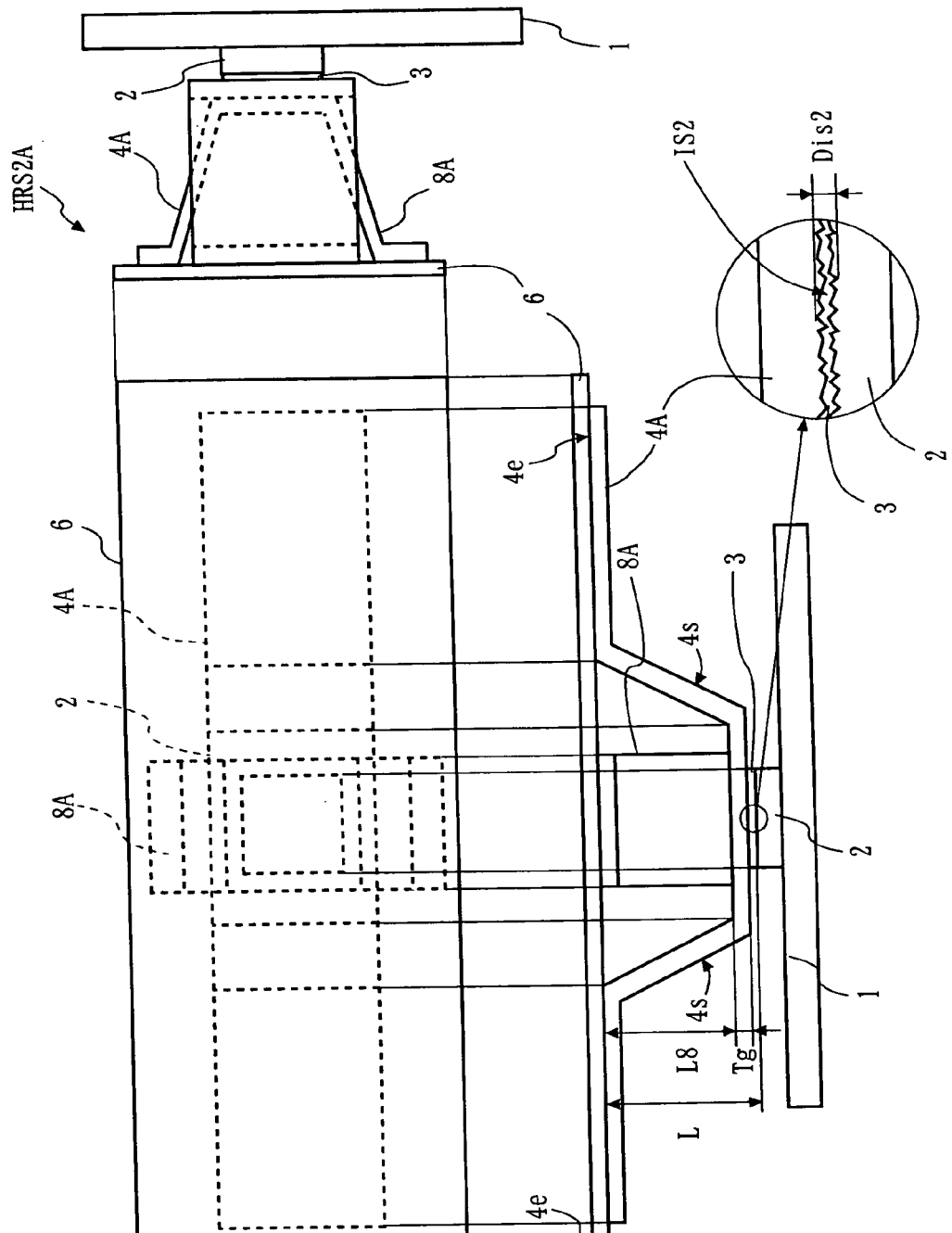
FIG. 3 is a side view showing a variant example of the heat-radiating structure shown in FIG. 2.

Referring to FIG. 3, a first variant example of the heat-radiating structure HRS2 of the second embodiment will be described. In the heat-radiating structure HRS2A of this variant example, the elastic member 8 in the heat-radiating structure HRS2 is replaced by a plate spring 8A, and the graphite sheet 4 is replaced by a graphite sheet 4A. The graphite sheet 4A is obtained by coating the surface of the graphite sheet 4 with a thin film resin such as a polyester foil in order to protect the graphite sheet 4 from damages caused by a contact with the plate spring 8A. In this variant example, the plate spring 8A is provided in the keyboard supporting plate 6, but when this causes a problem in the strength, the plate spring 8A can be provided in another portion of the personal computer, for example, the housing.

The above-described elastic member 8 and the plate spring 8A can have any shape, instead of the shapes shown in FIG. 2 and FIG. 3, respectively, as long as they can press the central lower surface 4c of the graphite sheet 4 against the CPU 2 stably with a desired compressing force.

Figure 4:
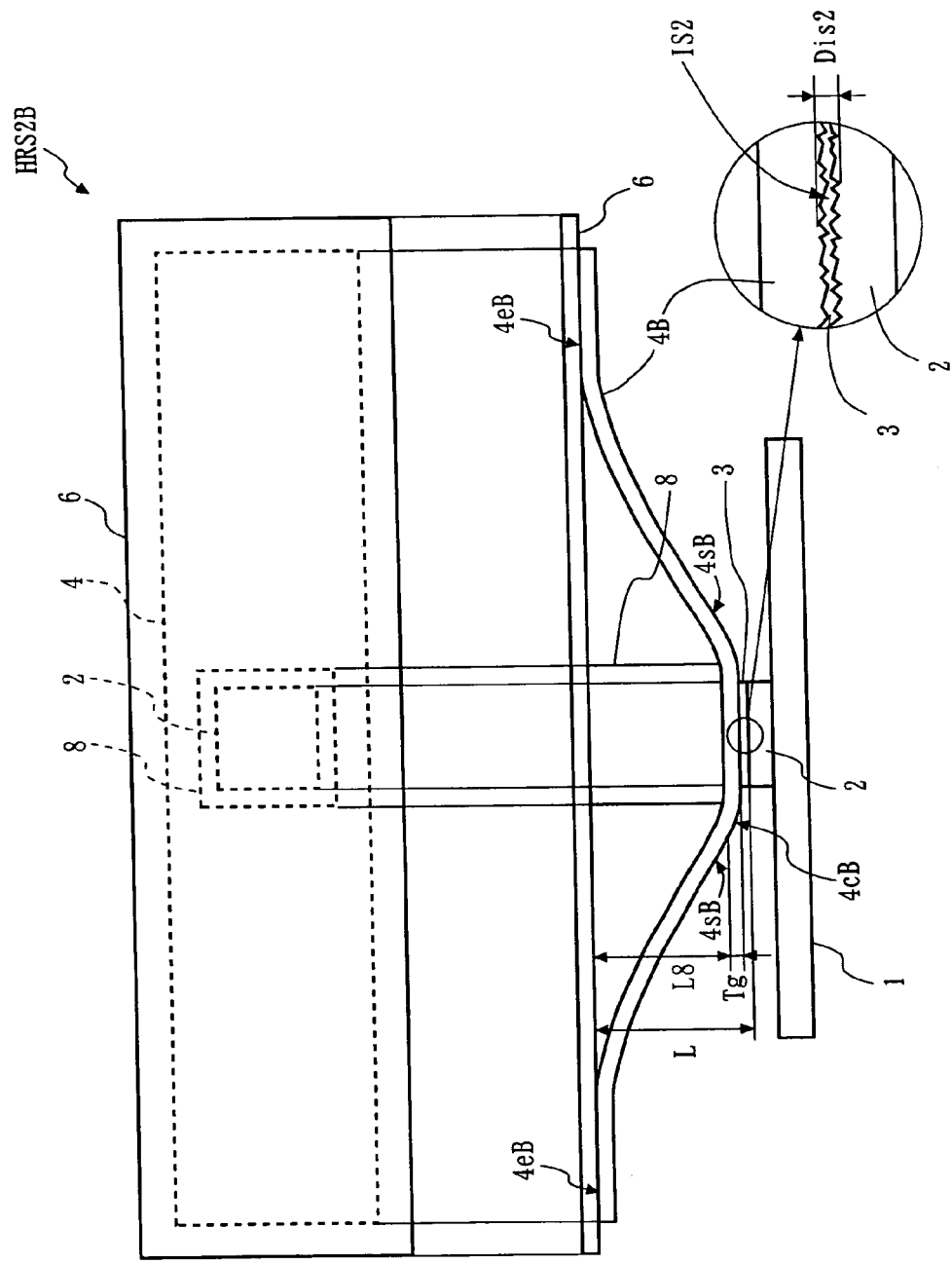
FIG. 4 is a side view showing another variant example of the heat-radiating structure in FIG. 2.

Referring to FIG. 4, a second variant example of the heat-radiating structure HRS2 of the second embodiment will be described. In the heat-radiating structure HRS2B of this variant example, the graphite sheet 4 in the heat-radiating structure HRS2 is replaced by a graphite sheet 4B. The graphite sheet 4B is not shaped into an elastic structure by being bended, unlike the graphite sheet 4 and the graphite sheet 4A, and one graphite sheet is used with the original state kept. That is to say, the graphite sheet 4B does not have portions directly corresponding to each of the two end portions 4e, the rising portions 4s and the central portion 4c in the graphite sheet 4 and the graphite sheet 4A. However, for convenience for description, positionally approximately corresponding portions are denoted by both end portions 4eB, rising portions 4sB and a central portion 4cB, respectively.

In the heat-radiating structure HRS2B, both the end portions 4eB are fixed mechanically to the keyboard supporting plate 6 in such a manner that the central portion 4cB of the graphite sheet 4B can be suspended and can be in contact with the CPU 2 in at least a predetermined area. The position at which both the end portions 4eB are fixed to the keyboard supporting plate 6 may be about the same as the position at which both the end portions 4e are fixed to the keyboard supporting plate 6. However, the graphite sheet 4B does not have an elastic structure, so that the thermal conduction resistance space IS2 generated between the graphite sheet 4B and the CPU 2 cannot be eliminated, and also it is difficult for the lower surface of the central portion 4cB to be in surface contact with the surface of the CPU 2.

Therefore, the elastic member 8 provided between the keyboard supporting plate 6 and the graphite sheet 4B presses the lower surface of the central portion 4cB to the CPU 2 for tight attachment. The graphite sheet 4B that is fixed to the keyboard supporting plate 6 while being bended is also a kind of elastic structure. However, the graphite sheet 4B cannot be expected to have adherence with the CPU 2 by the pressing force stemming from the elastic structure by folding as in the graphite sheet 4 and the graphite sheet 4A. Therefore, in order to ensure that the lower surface of the central portion 4cB is tightly attached to the entire surface of the CPU 2, it is preferable that the cross-sectional area of the elastic member 8 used in the heat-radiating structure HRS2B is larger than the surface area of the CPU 2. Instead of the elastic member 8, the above-described plate spring 8A may be used. Furthermore, in the case where the plate spring 8A is used, it is preferable that the graphite sheet 4B is configured such that the surface of the graphite sheet 4B is covered with a thin film resin such as a polyester foil in order to protect it from damages due to a contact with the plate spring 8A, as in the case of the graphite sheet 4A.

As described above, in the heat-radiating structure HRS2B, it is not necessary to bend the graphite sheet 4B, so that this structure is better in terms of the workability than in the case of the graphite sheet 4, the graphite sheet 4A or the like. Furthermore, in the graphite sheet 4, the graphite sheet 4A or the like, it is necessary to bend and shape the graphite sheet into a predetermined shape in accordance with the shape or the size of a portion to which it is to be attached. In addition, the graphite sheet 4 or the graphite sheet 4A that has been bended and shaped in advance significantly limits the portion to which it can be attached and therefore cannot be used for radiation in the other portions. On the other hand, the graphite sheet 4B can be used without being bended and therefore is more economical since the degree of limitation regarding the location in which it is to be attached is smaller.

Figure 5:
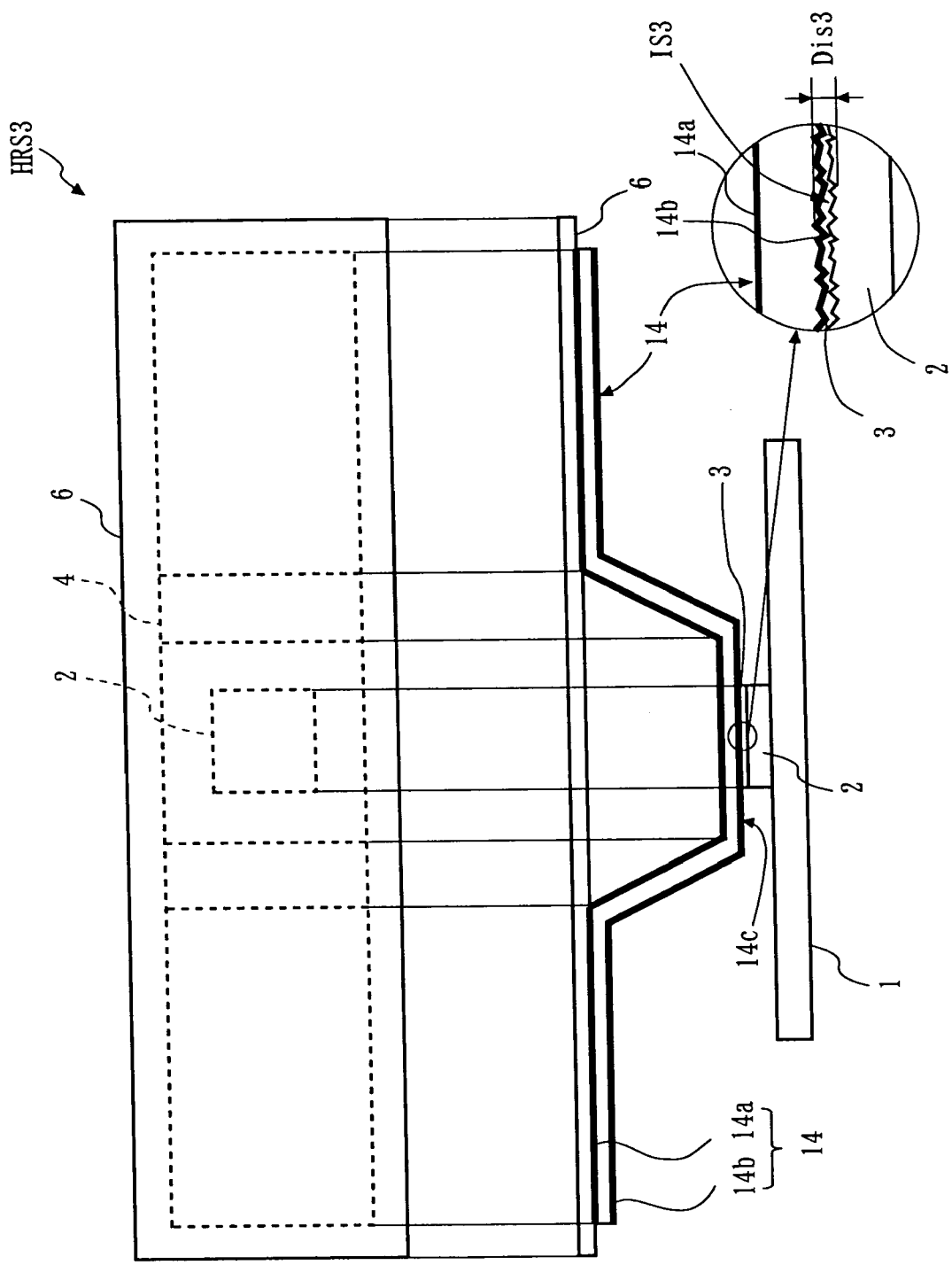
FIG. 5 is a side view showing a heat-radiating structure of a third embodiment of the present invention.

The heat-radiating mechanism of an electronic apparatus of a third embodiment of the present invention will be described with reference to FIG. 5. Similarly to FIG. 1, FIG. 5 shows a cross section of the heat-radiating mechanism configured inside a notebook-type personal computer as an example of an electronic apparatus. A heat-radiating structure HRS3 of this embodiment is obtained by replacing the graphite sheet 4 in the heat-radiating structure HRS1 shown in FIG. 1 by a graphite multilayered sheet 14. In this embodiment, a space (clearance) between the graphite multilayered sheet 14 and the CPU 2 is referred to as "thermal conduction resistance space IS3" (not shown). The distance in which the graphite multilayered sheet 14 is spaced apart from the CPU 2 is referred to as "resistance distance Dis3" (not shown), and the area in which the thermal conduction resistance space IS3 is present in the direction parallel to the graphite multilayered sheet 14 and the CPU 2 is referred to as "resistance area Ais3". The size of the thermal conduction resistance space IS3 is referred to as "thermal resistance space size Vis3".

The graphite multilayered sheet 14 is formed by sandwiching a flexible graphite sheet 14a having a thermal conductivity in the plane direction of 100 (W/mK) or more and a thickness of 0.5 to 2.0 mm by thin metal foils 14b such as aluminum foils or copper foils having a thickness of 0.01 mm to 0.2 mm. Similarly to the heat-radiating structure HRS1, the upper surfaces of both ends of the graphite multilayered sheet 14 are tightly fixed to the keyboard supporting plate 6 with mechanical means such as screws.

In this embodiment, the graphite multilayered sheet 14 is constituted by the flexible graphite sheet 14 and the thin metal foils 14a and 14b, so that the graphite multilayered sheet 14 is bonded by the adsorptive power of the heat-radiating grease 3 applied to the CPU 2, and therefore no clearance is generated between the CPU 2 and the graphite multilayered sheet 14.

Thus, the thermal resistance between the CPU 2 and the graphite multilayered sheet 14 and between the graphite multilayered sheet 14 and the keyboard supporting plate 6 can be reduced. In addition, the metal foils 14b on the surface of the graphite multilayered sheet 14 have a volume specific heat higher than and a thermal conductivity equal to or higher than the graphite sheet 14a in the middle portion of the graphite multilayered sheet 14. Therefore, the overall heat-radiating performance when radiating the heat in a heat-generating component in a notebook-type personal computer can be increased by a greater amount than when the heat-radiating plate is constituted only by a graphite sheet.

Figure 6:
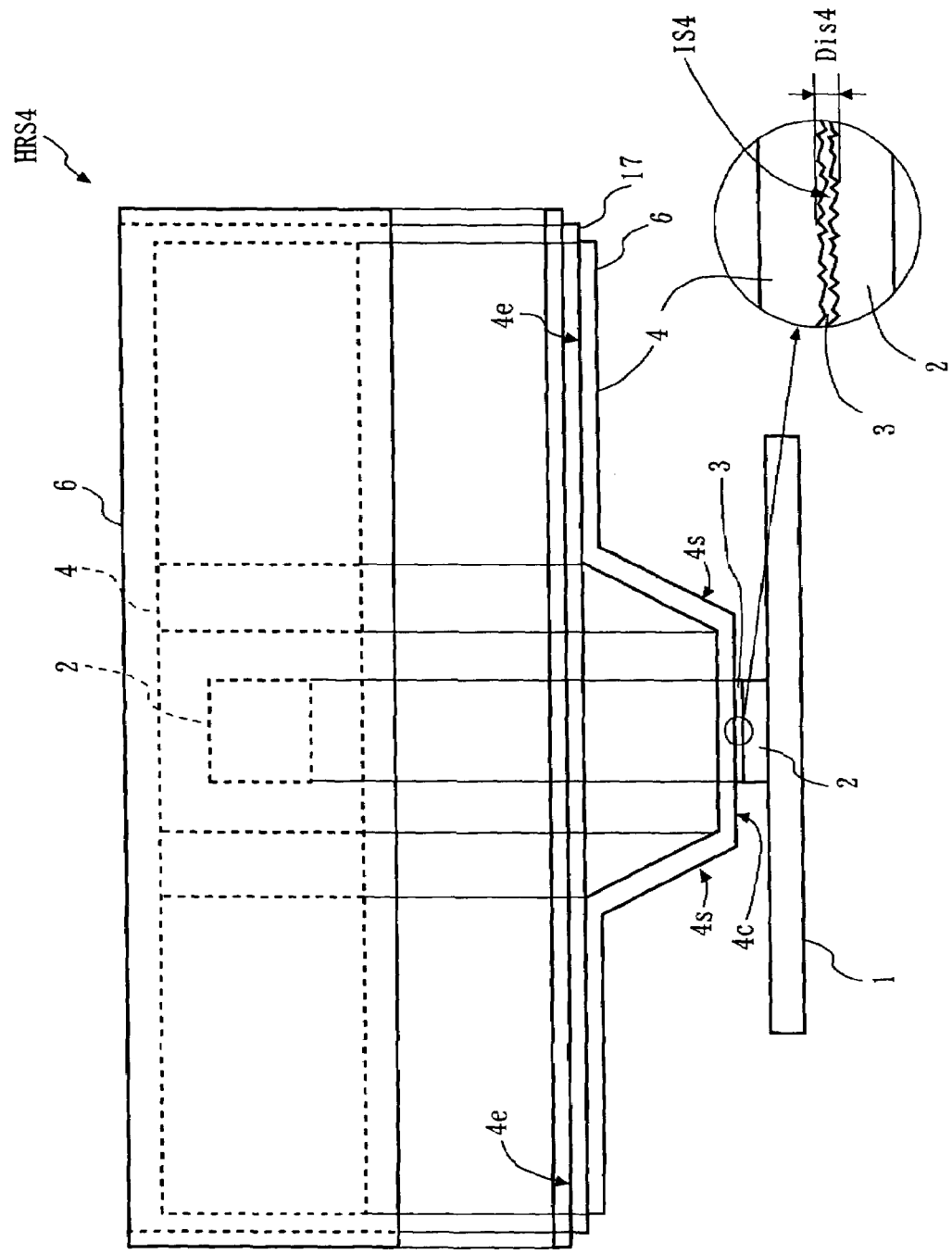
FIG. 6 is a side view showing a heat-radiating structure of a fourth embodiment of the present invention.

The heat-radiating mechanism of an electronic apparatus of a fourth embodiment of the present invention will be described with reference to FIG. 6. Similarly to in FIG. 1, FIG. 6 shows a cross section of the heat-radiating mechanism configured inside a notebook-type personal computer as an example of an electronic apparatus. A heat-radiating structure HRS4 of this embodiment is configured by additionally providing a graphite sheet 17 having a thickness of 0.1 mm to 1.0 mm between the graphite sheet 4 and the keyboard supporting plate 6 in the heat-radiating structure HRS1 shown in FIG. 1.

The graphite sheet 17 is attached to the keyboard supporting plate 6. The upper surfaces of both ends of the graphite sheet 4 are tightly fixed and thermally connected to the keyboard supporting plate 6 with mechanical means such as screws via the graphite sheet 17.

In this embodiment, a space (clearance) between the graphite sheet 4 and the CPU 2 is referred to as "thermal conduction resistance space IS4" (not shown). The distance in which the graphite sheet 4 is spaced apart from the CPU 2 is referred to as "resistance distance Dis4" (not shown), and the area in which the thermal conduction resistance space IS4 is present in the direction parallel to the graphite sheet 4 and the CPU 2 is referred to as "resistance area Ais4". The size of the thermal conduction resistance space IS4 is referred to as "thermal resistance space size Vis4".

The contact thermal resistance between the graphite sheet 17 and the graphite sheet 4 is smaller than the contact thermal resistance between the graphite sheet 4 and the keyboard supporting plate 6. Therefore, the heat-radiating performance in the plane direction can be improved more than in the case of the heat-radiating structure HRS1, and the temperature of the surface of the keyboard can be reduced by utilizing the high thermal conductivity in the plane direction and the low thermal conductivity in the cross sectional direction of the graphite sheet 17 to release the heat from the graphite sheet 4 to the graphite sheet 17 attached to the keyboard supporting plate 6.

While the embodiments have been individually described as above, the configuration can be obtained by any combination thereof. As described above, the present invention can be utilized to radiate heat out of a portable electronic apparatus such as a notebook-type personal computer.

While the invention has been described in detail, the foregoing description is in all aspects illustrative and not restrictive. It is understood that numerous other modifications and variations can be devised without departing from the scope of the invention.

What is claimed is:

1. A heat-radiating structure in which heat generated in a heat-generating component of an electronic apparatus is conducted to the outside, comprising:
a single flexible first graphite sheet configured to be elastic by being folded from a first edge of the sheet to a second edge of the sheet to form a central portion on a first plane, a first end portion and a second end portion, both being positioned substantially on a second plane parallel to the first plane, a first rising portion rising at a predetermined angle from the central portion to the first end portion, and a second rising portion rising at the predetermined angle from the central portion to the second end portion,
wherein the central portion is elastically supported by the rising portions to form a free space between the central portion, the first rising portion, and the second rising portion,
wherein the central portion of the first graphite sheet is thermally connected to the heat generating component, and at least one of the two end portions is thermally connected to a heat radiating component, and
wherein a flexible thermal conductive material is provided between the central portion and the heat generating component.

2. The heat-radiating structure according to claim 1, wherein the graphite sheet is folded such that the rising portions define intersecting planes.

3. The heat-radiating structure according to claim 1, wherein the heat-radiating component is a keyboard supporting plate of an electronic apparatus.

4. The heat-radiating structure according to claim 1, wherein the central portion of the first graphite sheet is connected to the heat-generating component in a non-fixed manner.

5. The heat-radiating structure according to claim 4, wherein at least one of the two end portions of the first graphite sheet is connected to the heat-radiating component in a fixed manner.

6. The heat-radiating structure according to claim 1, further comprising a second graphite sheet between at least one of the two end portions of the first graphite sheet and the heat-radiating component,
wherein at least one of the two end portions is thermally connected to the heat-radiating component by the second graphite sheet.

7. The heat-radiating structure according to claim 1, wherein the first graphite sheet has a thickness of at least 0.5 mm and at most 2.0 mm.

8. The heat-radiating structure according to claim 6, wherein the second graphite sheet has a thickness of at least 0.1 mm and at most 1.0 mm.

9. The heat-radiating structure according to claim 7, wherein the first graphite sheet is a multilayered sheet including either one of an aluminum foil and a copper foil having a thickness of at least 0.01 mm and at most 0.2 mm.

10. The heat-radiating structure according to claim 1, wherein the flexible thermal conductive member is either one of heat-radiating grease and heat-radiating elastomer having an adsorptive power.

11. The heat-radiating structure according to claim 10, wherein the heat-radiating grease and the heat-radiating elastomer have a thickness of 0.3 mm or less.

12. The heat-radiating structure according to claim 7, wherein the first graphite sheet is coated with a thin film resin.

* * * * *